United States Patent [19]

Sawada et al.

[11] Patent Number: 5,111,275

[45] Date of Patent: May 5, 1992

[54] MULTICELL SEMICONDUCTOR MEMORY DEVICE

[75] Inventors: Shizuo Sawada; Masaki Ogihara, both of Yokohama, Japan

[73] Assignee: Kabushiki Kaisha Toshiba, Kawasaki, Japan

[21] Appl. No.: 286,018

[22] Filed: Dec. 19, 1988

[30] Foreign Application Priority Data

Dec. 22, 1987 [JP] Japan ................ 62-324478

[51] Int. Cl.[5] ............ H01L 23/48; H01L 29/46; H01L 29/54
[52] U.S. Cl. ................ 357/71; 357/23.6; 357/41; 357/45; 357/68
[58] Field of Search ......... 357/23.6, 68, 30 Q, 357/30 H, 40, 71, 45, 23.5, 41

[56] References Cited

U.S. PATENT DOCUMENTS

| | | | |
|---|---|---|---|
| 4,649,412 | 3/1987 | Iwase et al. | 357/41 |
| 4,707,457 | 11/1987 | Erb | 357/68 |
| 4,754,313 | 6/1988 | Takemae et al. | 357/23.6 |
| 4,792,834 | 12/1988 | Uchida | 357/41 |
| 4,796,072 | 1/1989 | Higashi et al. | 357/40 |
| 4,801,989 | 1/1989 | Taguchi | 357/23.6 |
| 4,803,535 | 2/1989 | Taguchi | 357/23.6 |
| 4,833,518 | 5/1989 | Matsuda et al. | 357/41 |
| 4,859,619 | 8/1989 | Wu et al. | 357/41 |
| 4,937,645 | 6/1990 | Ootsuka et al. | 357/42 |
| 4,961,104 | 10/1990 | Hirakawa | 357/71 |

FOREIGN PATENT DOCUMENTS

| | | | |
|---|---|---|---|
| 0191612 | 8/1986 | European Pat. Off. | 357/23.6 |
| 0038252 | 2/1988 | Japan | 357/23.6 |
| 0281457 | 11/1988 | Japan | 357/23.6 |

*Primary Examiner*—Rolf Hille
*Assistant Examiner*—Minhloan Tran
*Attorney, Agent, or Firm*—Finnegan, Henderson, Farabow, Garrett, and Dunner

[57] ABSTRACT

A semiconductor device is disclosed which connects a bit line via a bit line contact to cells in a dynamic access memory which are constructed of a transistor and capacitor. The semiconductor device includes a first conductive layer connected to the cell of a cell array via a bit line contact and a second conductive layer connected to the first conductive layer via a contact hole which is formed over the first conductive layer. By providing the first conductive layer between the bit line contact and the bit line, it is possible to increase a flat line width around a bit line contact and hence to adequately lower the bit line's resistance.

14 Claims, 5 Drawing Sheets

MULTICELL SEMICONDUCTOR MEMORY DEVICE

BACKGROUND OF THE INVENTION

1. Field of the Invention

The present invention relates to a semiconductor device which improves a connection between a bit line and a cell of dynamic access memory.

2. Description of the Related Art

FIGS. 1A and 1B show a memory cell in a dynamic access memory which comprises a capacitor, transistor and bit line contact. FIG. 1B shows a cross-sectional view as taken along line A—A in FIG. 1A. In the memory cell, transfer transistor (MOS transistor) 10 is made up of gate 2, source 4a and drain 4b. With the gate voltage of transfer transistor 10 raised, a signal to bit line 1 is written as data into a capacitor between capacitor plate 3 and substrate 8 via transfer transistor 10 and, with the aforementioned gate voltage lowered and hence MOS transistor 10 OFF, is stored as data. At the read time, on the other hand, the gate voltage of transfer transistor 10 is raised and hence MOS transistor 10 is turned ON. A corresponding voltage is sent to bit line and then amplified by a sense amplifier which is connected to the bit line. It is thus judged whether data is "0" or "1". The semiconductor device of FIG. 1B includes insulating interlayer 5, capacitor gate insulating film 6, transfer transistor insulating film 9 and bit line contact 11.

FIGS. 2A and 2B show a cell array corresponding to the memory as shown in FIGS. 1A and 1B. Bit line 1 extends over cell element area 20 and is connected to bit line contact 11 for each respective cell element area 20. In the cell array, reference numeral 2 shows gate 1 bit line; 4, source and drain regions; 5, an insulating interlayer; 6, a capacitor gate insulating film; 7, a transfer transistor insulating film; 9, a field insulating film; and 11, a bit line contact.

When a greater number of contact holes for bit line contact formation are to be formed in a semiconductor layer structure, some of them are left unopened. In order to raise the electrical conductivity, which is the ratio between an actual number of contact holes as distinct from a total number of holes formed and those contact holes left unopened, it is necessary to form bigger contact holes. As a result, a flat bit line width (twice an X value in FIG. 1A) is narrowed around the contact hole, causing an increase in bit line resistance and hence a margin drop in the memory cell's sense amplifier operation.

In order to cope with the aforementioned drawback, an attempt has been made to thicken bit line 1 around bit line contact 11, that is, to increase the X value. In the conventional cell pattern, however, if the aforementioned X value is increased, then the distance between bit lines 1 is decreased, causing the occurrence of a short between the bit lines. In the cell pattern, it appears possible to increase the X value if an alternate array of bit line contact 11 on upper bit line 1 and bit line contact 11 on lower bit line 1 is employed. It is, however, difficult to change the cell array shown in FIGS. 2A and 2B, because the cell array of FIG. 2 is of a folded bit line type.

The following explains why the bit lines' resistance rises in the conventional system.

It is necessary to lower the bit lines' resistance because a rise in the bit line's resistance occurs due to the deposition of a silicide film by an ordinary sputtering method. That is, this occurs due to the prominent thinning of the silicide film at the contact site resulting from a poor converage rate at the contact area, that is, the ratio between the vertical thickness of the bit line at the contact site and the thickness of the flat area of the bit line relative to the contact site. In order to solve the problem, it is preferable that the silicide film be deposited on the associated semiconductor structure by virtue of a vacuum CVD method by which a high degree of coverage is obtained at the corner site and groove area. However, the method is now at the development stage and cannot be introduced in the production line of LSI's.

SUMMARY OF THE INVENTION

It is accordingly the object of the present invention to provide a semiconductor device which optimizes a pattern of bit lines and bit line contacts and a resultant construction to adequately lower a bit line's resistance.

According to the present invention, a semiconductor device is disclosed which connects a bit line via a bit line contact to cells in a dynamic access memory, the device including a first conductive layer connected via the bit line contact to the cells of the memory cell array and a second conductive layer connected to the first conductive layer via a contact hole which is formed over the first conductive layer. By providing the first conductive layer between the bit line contact and the bit line it is possible to increase a flat line width around the contact of the bit line and hence to adequately lower the bit line's resistance.

BRIEF DESCRIPTION OF THE DRAWINGS

FIG. 1 is a plan view showing a conventional semiconductor device and FIG. 1B is a cross-sectional view taken along line A—A in FIG. 1A;

DETAILED DESCRIPTION OF THE PREFERRED EMBODIMENTS

The embodiments of the present invention will be explained below with respect to the accompanying drawings.

Figures 1A, 1B:
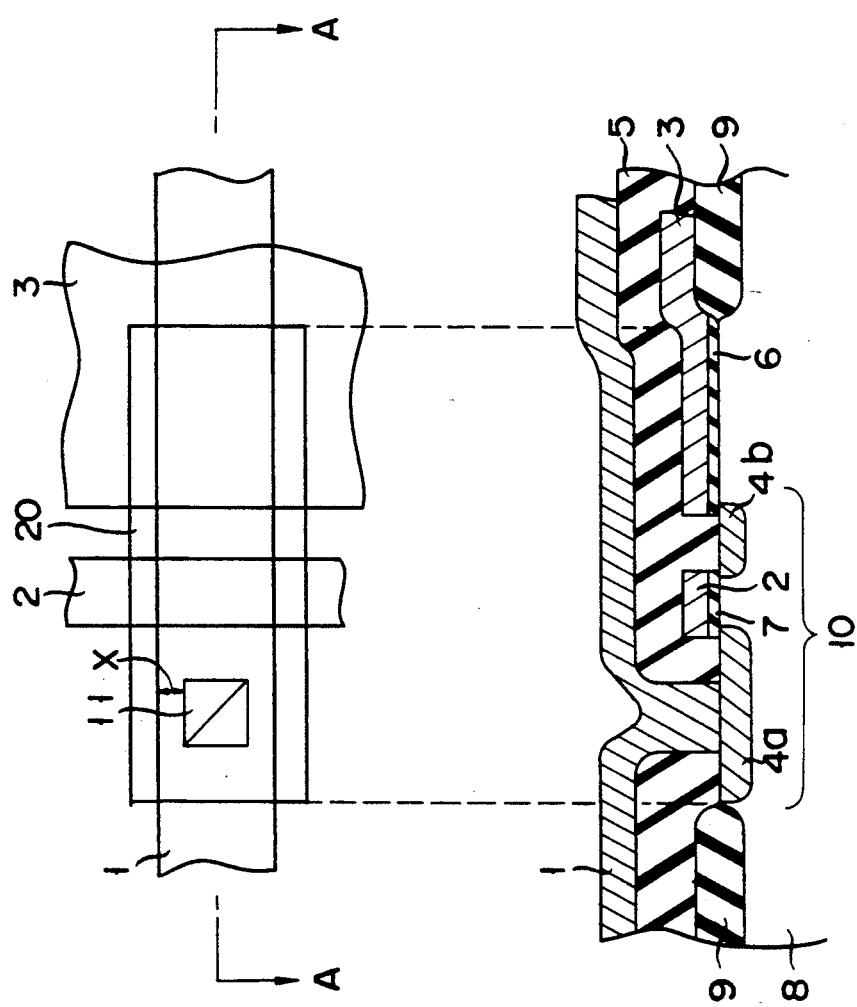
Figure 2A:
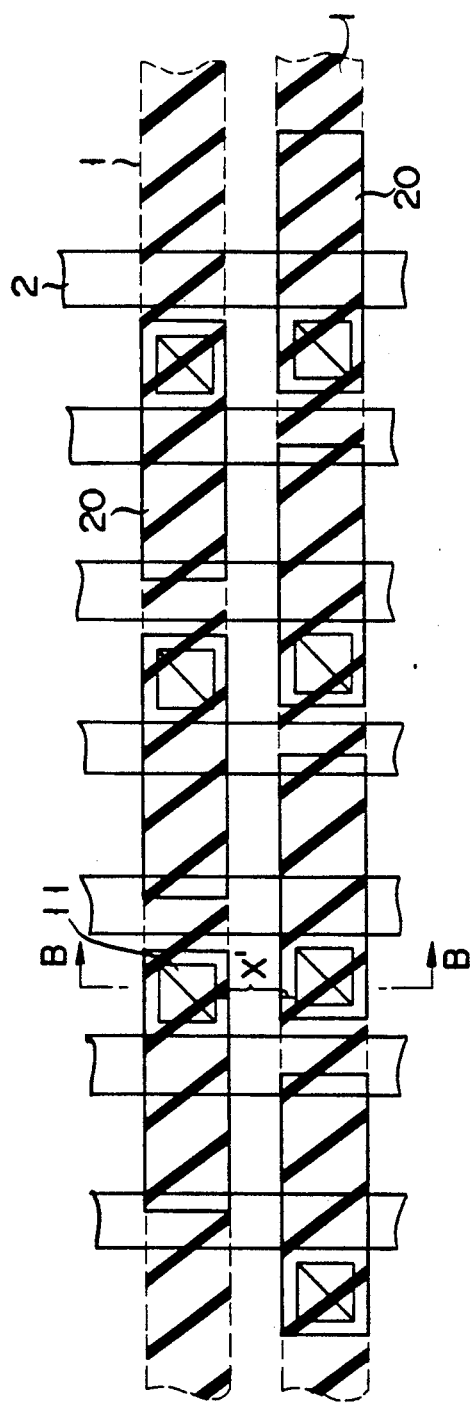
FIG. 2A is a plan view showing a memory array of the conventional semiconductor device and FIG. 2B is a cross-sectional view taken along line B—B in FIG. 2A.
Figure 2B:
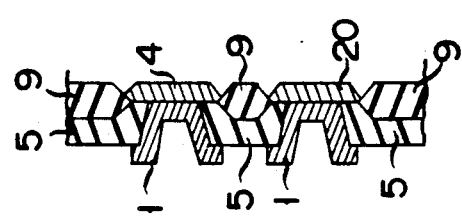
Figure 3A:
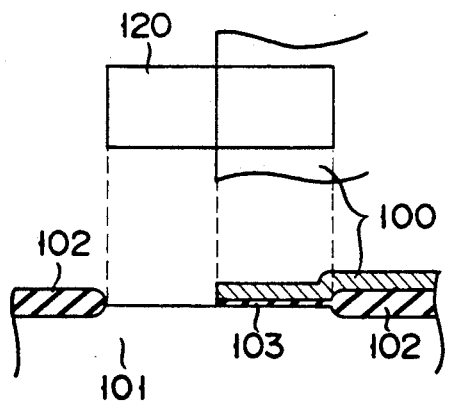
FIGS. 3A to 3D show plan views and associated cross-sectional views showing the manufacturing process of a semiconductor device according to an embodiment of the present invention.
Figure 3B:
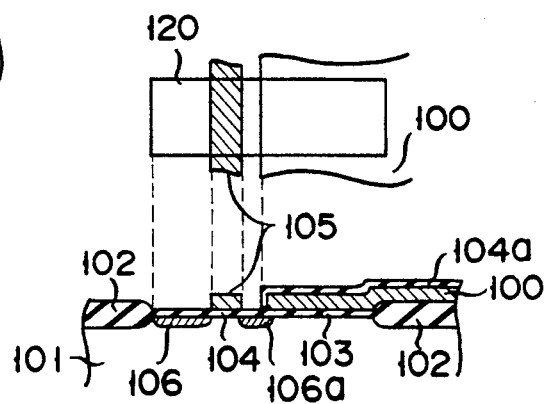

FIGS. 3A and 3B, respectively, show a plan view and associated cross-sectional view of a semiconductor device according to one embodiment of the present invention. Specifically, as shown in FIG. 3A, cell element area 120 is formed by a LOCOS method in silicon substrate 101, and field oxide film 102 is formed as thermal oxidation film about 5000Å thick for an element isolation area on the resultant semiconductor structure. Then first oxide film 103 is formed as a 100Å thick thermal oxidation film on cell element area 120 and a poly-Si film, containing a first N type impurity for first gate electrode 100, is formed on the whole surface of the resultant structure. A poly Si silicon, containing a first N type impurity, is patterned by a photoetching method on the resultant structure to provide gate electrode 100. First gate oxide film 103 is formed by an etching step on the semiconductor structure with first gate electrode 100 as a mask to expose part of silicon substrate 101.

As shown in FIG. 3B, second gate oxide film 104 is formed on the exposed part of silicon substrate 101 at which time oxide film 104 is formed on the side surface and upper surface of first gate electrode 100. A poly-Si film, containing a second N type impurity for second gate electrode 105, is deposited on the whole surface of the semiconductor structure. Second gate electrode 105 is formed by the photoetching method on the surface of the semiconductor structure so as to obtain a gate electrode for a transfer electrode. With second gate electrode 105 as a mask, arsenic ions are implanted, at $5 \times 10^{15}$ cm$^{-2}$ and 50 KV, into those regions corresponding to source and drain diffusion layers 106 and 106a.

Figure 3C:
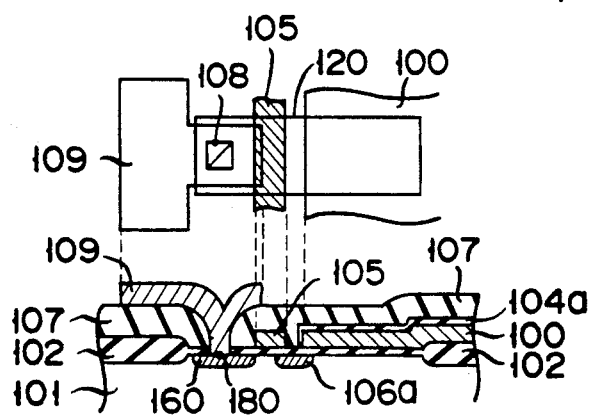

As shown in FIG. 3C, first CVD SiO$_2$ film 107 is deposited to a depth of about 3000Å, on the whole surface of the resultant structure. The structure is heat-treated for about 30 minutes within an N$_2$ atmosphere to provide source and drain diffusion layers 106 and 106a. Contact hole 108 is so formed in first CVD SiO$_2$ film 107 as to correspond to a bit line contact site. A third poly-Si film is deposited on the whole surface of the semiconductor structure and, after heat treatment of the structure in a POCl$_3$ atmosphere, an N type impurity is diffused down into the third poly-Si film and silicon substrate 101. In this way, ohmic contact is made across the third poly-Si film and N-type source diffusion layer 106. Third poly-Si pattern is formed as first conductive film 109 to obtain bit line contact with the near-by cell.

Figure 3D:
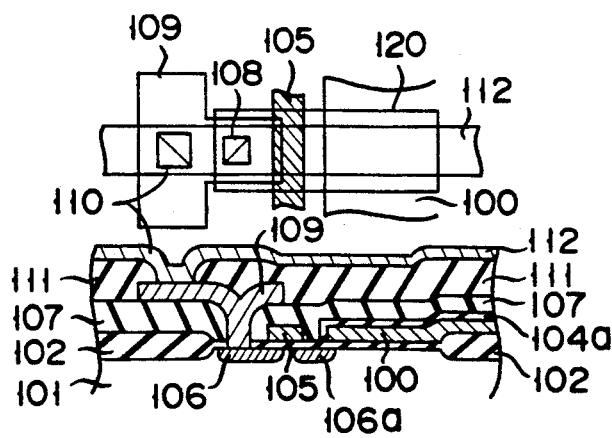

As shown in FIG. 3D, second CVD SiO$_2$ film 111 is deposited, as a 5000Å film, on the whole surface of the semiconductor substrate and a contact hole is formed in the exposed surface part of third poly-Si pattern 109. An MoSi film is deposited by a sputtering method on the structure. Then the MoSi$_2$ pattern is formed by the photoetching method to provide bit line 112 for the formation of a second conductive layer.

Figure 4A:
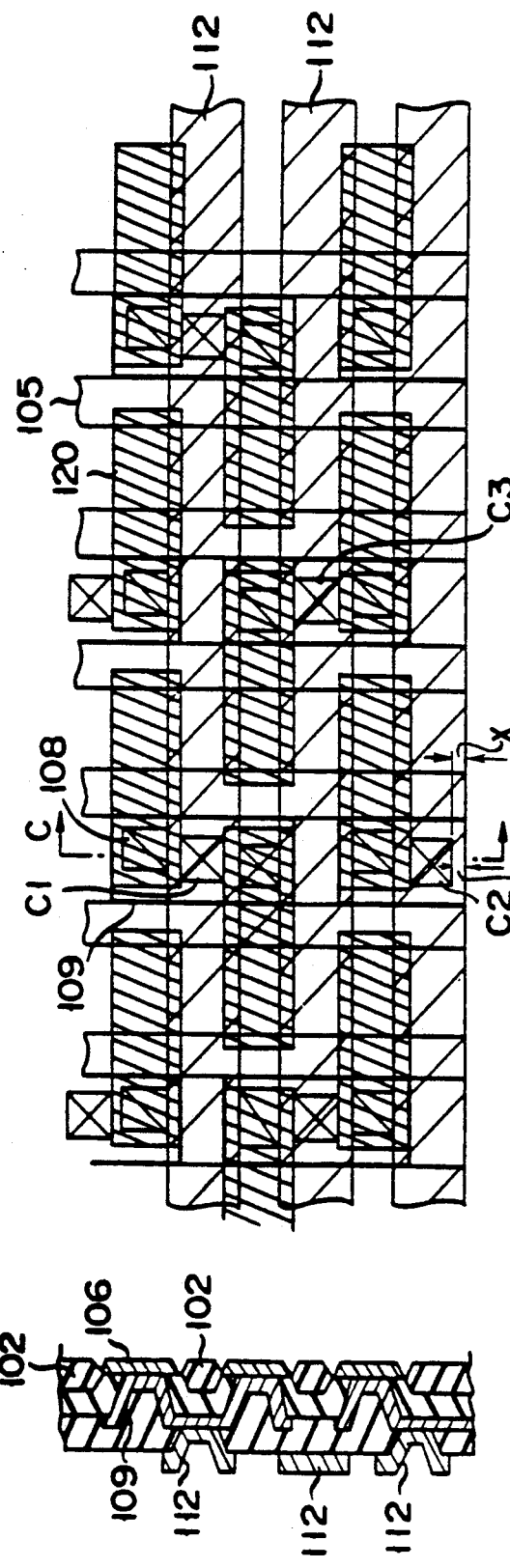
FIG. 4A is a plan view showing a memory cell array pattern of the semiconductor device of the present invention and FIG. 4B is a cross-sectional view taken along line C—C in FIG. 4A.
Figure 4B:
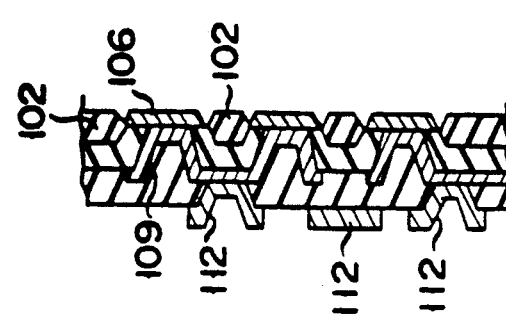
Figure 5:
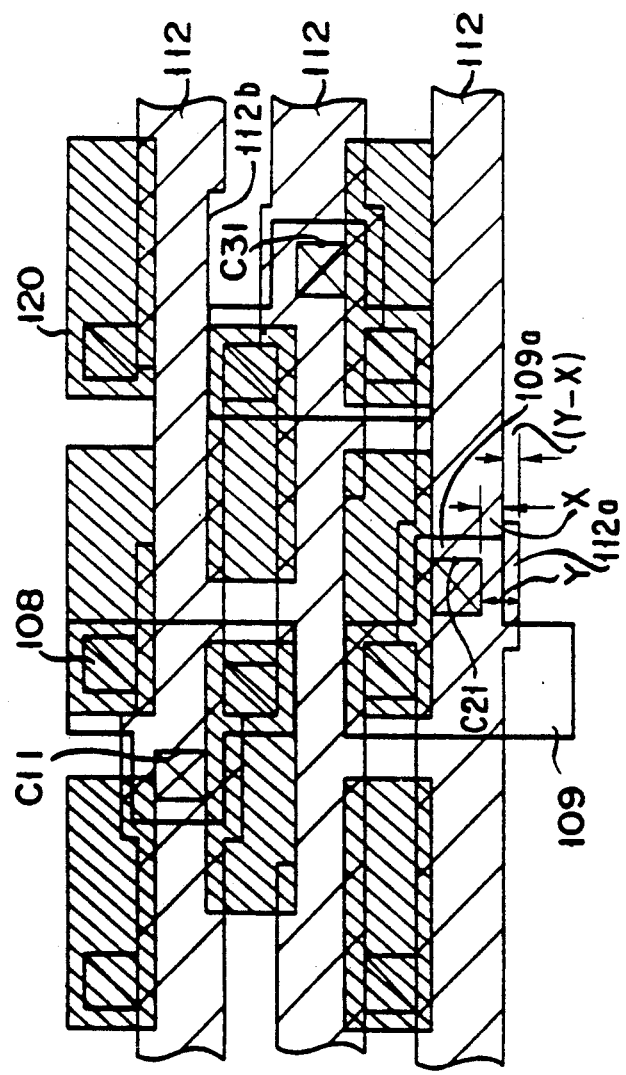
FIG. 5 is a plan view showing another array pattern of the semiconductor device of the present invention.

FIGS. 4A, 4B and 5 show one form of a cell array as shown in FIG. 3A to 3D. As shown in FIGS. 4A, 4B and 5, a bit line is formed between cell arrays. FIG. 4B shows a cross-sectional view taken along line C—C in FIG. 4A. In this pattern array, a capacitor plate electrode pattern (first gate electrode 100) is omitted in FIGS. 4A, 4B. In the arrangement of FIGS. 4A, 4B, bit line 112 is located over an element isolation field (field oxide film 102) where, for example, a cell transistor and capacitor are not formed. Therefore, an underlying step coverage for bit line 112 becomes smaller as its extent of "step" and, as a result, a high coverage rate is obtained at a location of the semiconductor structure overlying the step coverage of bit line 112 preventing an increase in bit line resistance. $C_1$, $C_2$ and $C_3$ are contacts between bit line 112 and third poly-Si pattern 109.

FIG. 5 shows an array pattern for preventing an increase in bit line resistance. By changing the array of third poly-Si pattern 109 it is possible to increase the flat line width of bit line 112 which is located around the contact ($C_{11}$, $C_{21}$, $C_{31}$) between bit line 112 and third poly-Si pattern 112. As can be seen from FIG. 5, the bit margin Y value of the contact ($C_{11}$, $C_{21}$, $C_{31}$) over third poly-Si pattern 109 can be taken as a greater value than in the conventional pattern. In this case, however, a decrease in the line width of bit line 112 corresponds to a (Y-X) value, but if the bit line margin X value of the bit line contact site as in FIGS. 4A, 4B takes a greater value it is necessary to make the (Y-X) value twice that value. Contacts ($C_{11}$, $C_{21}$, $C_{31}$) of FIG. 5 are displaced in a corresponding relation to contacts ($C_1$, $C_2$, $C_3$) in FIG. 4A.

FIG. 5 shows an array pattern for suppressing an increase in bit line resistance. By improving the array of third poly-Si pattern 109 it is possible to increase the line width of bit line 112 around the contact ($C_{11}$, $C_{21}$, $C_{31}$) between bit line 112 and third poly-Si pattern 109.

That is, in the array pattern shown in FIG. 5, third poly-Si pattern 109 is formed as a rectangle with a square attached as a projection to the vertical side face of the first-mentioned rectangle in which case adjacent third poly-Si pattern 109 is formed in the same shape as that of the first-mentioned third poly-Si pattern 109 except that a projection of adjacent poly-Si pattern 109 extends in a direction opposite to that in which the first-mentioned projection extends. At a location of projection 109a, contact is made between Poly-Si pattern 109 and bit line 112 to provide contact $C_{11}$, $C_{21}$ and $C_{31}$. It is thus possible to increase the line width of bit line 112 around each contact ($C_{11}$, $C_{21}$, $C_{31}$). In the case where, in order to increase the line width of bit line 112 around the contacts ($C_{11}$, $C_{21}$, $C_{31}$), provided enlarged spot 112a, and hence to suppress an increase in bit line resistance there, it is necessary that, in order to prevent a shorting between the adjacent bit lines, cutout 112b be provided just beneath or over the contact ($C_{11}$, $C_{21}$, $C_{31}$) around the bit line which is located adjacent to bit line 112 around the contact ($C_{11}$, $C_{21}$, $C_{31}$).

In the array pattern shown in FIG. 5, since projections 109a are provided vertically around contacts $C_{11}$, $C_{21}$, $C_{31}$ in the aforementioned opposite relation, it is not necessary to form the cutout at each side of bit line 112. It is possible to increase the flat line width of bit line 112 around the contacts ($C_{11}$, $C_{21}$, $C_{31}$), that is, the Y value of enlarged site 112a.

In the array pattern shown in FIG. 5, the width of cutout 112b of bit line 112 corresponds to the (Y-X) value. The X value corresponds to a distance from the side of the contact to the side of bit line 112.

In the array pattern shown in FIG. 5, since contacts $C_{11}$, $C_{21}$, $C_{31}$ are formed in the aforementioned opposite relation, the cutout of the adjacent bit line which corresponds to contacts $C_{11}$, $C_{21}$, $C_{31}$ is provided at only one side of the bit line, thus assuring a greater Y value.

Furthermore, a MoSi film which contains a low-ohmic metal, such as molybdenum, is formed by a sputtering method to provide bit line 112 as the second conductive layer. In this case, bit line 112 which is formed of the MoSi film is employed as an input line which is connected to a sense amplifier.

What is claimed is:

1. A semiconductor device comprising a semiconductor substrate; a plurality of memory cells constituting a memory cell array on a surface of the semiconductor substrate; a plurality of first conductive layers on the semiconductor substrate, each first conductive layer in contact with two memory cells; and a plurality of second conductive layers, each second conductive layer in contact with multiple first conductive layers.

2. The semiconductor device according to claim 1, wherein said plurality of second conductive layers are located at intermediate locations between adjacent memory cells.

3. The semiconductor device according to claim 1, wherein a first insulating film is on said array of memory cells, and each first conductive layer is connected to corresponding diffusion regions via a first contact hole in said first insulating film.

4. The semiconductor device according to claim 3, wherein a second insulating film is over said first insulating film and said plurality of first conductive layers and second plurality of conductive layers are such that they are in contact with said plurality of first conductive layers via a second contact hole in the second insulating film.

5. A semiconductor device comprising a semiconductor substrate; a plurality of memory cells constituting a memory cell array on a surface of the semiconductor substrate; a plurality of first conductive layers over the semiconductor substrate each in contact with two adjacent memory cells in the memory cell array, projections of the two adjacent memory cells extending in a mutually opposite rotation, and a second conductive layer over the first conductive layers in contact with multiple ones of the first conductive layers.

6. A semiconductor device comprising a semiconductor substrate; a plurality of memory cells constituting a memory cell array on a surface of the semiconductor substrate; a plurality of first conductive layers over the semiconductor substrate each in contact with two adjacent memory cells in the memory well array, projections of the two adjacent memory cells extending in a mutually opposite rotation, and a second conductive layer over the first conductive layers in contact with multiple ones of the first conductive layers, wherein said second conductive layer is located at an intermediate location of said two adjacent memory arrays.

7. A semiconductor memory device comprising:
a semiconductor substrate of a first conductivity type;
an array of memory cells, each cell having a diffusion region of a second conductivity type in a surface portion of said substrate;
a plurality of first conductive layers of the second conductivity type provided for the memory cells respectively each having a portion in contact with said diffusion region of the corresponding memory cell; and
a plurality of second conductive layers provided for the first conductive layers, each having multiple contacting portions, each contacting portion contacting a respective first conductive layer, each contacting portion being laterally removed from the memory cell contacting the corresponding first conductive layer.

8. The semiconductor memory device according to claim 7, wherein a first insulating film is on said array of memory cells, and each first conductive layer is connected to a corresponding diffusion region via a first contact hole in said first insulating film.

9. The semiconductor memory device according to claim 7, wherein a second insulating film is on said first insulating film and said plurality of first conductive layers, said plurality of second conductive layers are on said second insulating film, and each second conductive layer is connected to a first conductive layer via a second contact hole formed in said insulating film.

10. A semiconductor memory device comprising:
a semiconductor substrate of a first conductivity type;
an array of memory cells, each cell having a diffusion region of a second conductivity type in a surface portion of said substrate;
a plurality of first conductive layers of a second conductivity type provided for the memory cells, each having a portion in contact with the diffusion regions of at least two adjacent memory cells; and
a plurality of second conductive layers provided for the first conductive layers, each having a portion contacting a first conductive layer and located between the two adjacent memory cells.

11. A semiconductor device comprising
a first row of memory cells;
a second row of memory cells substantially parallel to the first row;
a first lower conductive layer having a contact area with a diffusion region in a cell in the first row;
second lower conductive layer having a contact area with a diffusion region in a cell in the second row;
a first upper conductive layer having a lateral dimension substantially parallel to the first row, and having a contact area with the first lower conductive layer displaced from the contact area between the first lower conductive layer and the diffusion region in the cell of the first row in a direction along the lateral dimension; and
a second upper conductive layer having a lateral dimension substantially parallel to the second row, and having a contact area with the second lower conductive layer displaced from the contact area between the second lower conductive layer and the diffusion region in the cell of the second row in an opposite direction along the lateral dimension.

12. The semiconductor device of claim 11, wherein the first upper conductive layer includes
a first width dimension in a portion opposite the contact area with the first lower conductive layer; and
a second width dimension, the first width dimension being larger than the second width dimension, and the second upper conductive layer includes
a first width dimension in a portion opposite the contact area with the second lower conductive layer; and
a second width dimension, the first width dimension being larger than the second width dimension.

13. The semiconductor device of claim 12, wherein the first upper conductive layer includes
a third width dimension in a portion opposite the first width dimension in the second upper conductive layer, the third width dimension being smaller than the second width dimension in the first upper conductive layer, and
the second upper conductive layer includes
a third width dimension in a portion opposite the first width dimension in the first upper conductive layer, the third width dimension being smaller than the second width dimension in the second upper conductive layer.

14. The semiconductor device of claim 13 further including
a third row of memory cells substantially parallel to the second row;
a third lower conductive layer having a contact area with a diffusion region in a cell in the third row; and
a third upper conductive layer having a lateral dimension substantially parallel to the third row, and having a contact area with the third lower conductive layer displaced from the contact area between the third lower conductive layer and the diffusion region in the cell of the third row in the direction along the lateral dimension.

* * * * *